Jan. 4, 1966 J. H. J. VAN DIJK ETAL 3,226,821

METHOD AND MEANS FOR DIP SOLDERING PRINTED CIRCUIT PANELS

Filed Feb. 8, 1962 3 Sheets-Sheet 1

INVENTOR
JOHANNES H. J.VAN DIJK
HENRI C.HAVERKORN VAN RIJSEWIJK
BY
Frank R. Trifari
AGENT

METHOD AND MEANS FOR DIP SOLDERING PRINTED CIRCUIT PANELS

Filed Feb. 8, 1962 3 Sheets-Sheet 2

INVENTOR
JOHANNES H. J. VAN DIJK
HENRI C. HAVERKORN VAN RIJSEWIJK
BY
AGENT

INVENTOR
JOHANNES H. J. VAN DIJK
HENRI C. HAVERKORN VAN RIJSEWIJK
BY
AGENT

United States Patent Office 3,226,821
Patented Jan. 4, 1966

3,226,821

METHOD AND MEANS FOR DIP SOLDERING PRINTED CIRCUIT PANELS

Johannes Henricus Joseph van Dijk and Henri Carel Haverkorn van Rijsewijk, Emmasingel, Eindhoven, Netherlands, assignors to North American Philips Company, Inc., New York, N.Y., a corporation of Delaware Filed Feb. 8, 1962, Ser. No. 171,992
Claims priority, application Netherlands, Feb. 20, 1961, 261,457
14 Claims. (Cl. 29—471.1)

Figure 1:
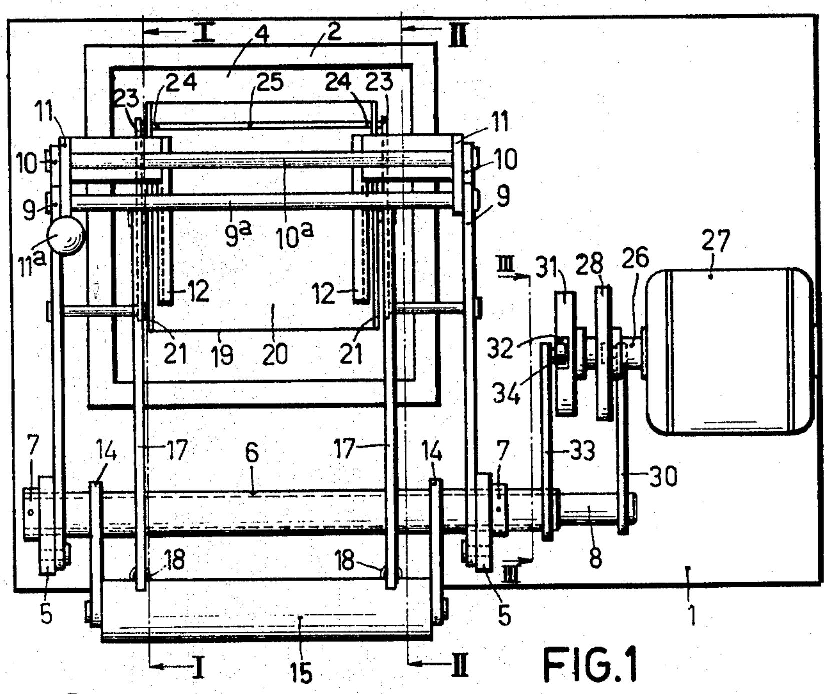

The invention relates to improvements of the known method and means for dip soldering, electrical component parts, bridge wires and the like to a so-called printed circuit board, in which the component projections or leads pass through apertures in the board. The printed circuit is located on the same side of the board as the free ends of the component leads and the component parts are therefore located on the other side. The projecting leads, after being provided with a flux for solder, are brought into contact with the surface of a liquid solder contained in a soldering bath. The invention also relates to a product of the process or mounting plate soldered according to the improved method and apparatus for performing this improved method.

Dip soldering as generally described above is known. However, the known soldering method can only be used if the distance between the various leads is not less than approximately 5 mm. If this distance becomes smaller, soldering according to the known method causes bridges of solder to be formed, as a result of which component parts are short-circuited. The distance of two mutually insulated leads in a printed circuit board consequently may not be smaller than 5 mm. However, it is of advantage and sometimes necessary to use a far smaller distance for small apparatus; in general, one would presently like to use a distance of approximately 2 mm. However, with this distance dip soldering is substantially impossible, since too many rejects occur by short-circuiting. The method according to the invention renders dip soldering possible with this small distance without undesired connections occurring and is characterized in that in the bath a member is provided with a large number of small apertures. This member is brought against the ends of the component projections or leads protruding from the circuit board a small distance as is known, with these ends still in contact with the solder and the member, the circuit board and the member are removed from the soldering bath together and remain at a short distance above the bath surface for a short while after which the member is replaced in the bath before solidification of the solder thereon occurs.

According to an embodiment of the invention, the member in the bath may consist of a quantity of steel wool enclosed in a mantle consisting of woven thin metal tape, which wool is provided with an adhering layer of solder. However, it may sometimes occur that a thin wire of the steel wool projects outside the mantle, and after soldering this wire is also soldered to the mounting plate and thus causes short-circuiting. This is prevented entirely if, according to another embodiment of the invention, the member consists of a perforated metal plate provided with an adhering layer of solder.

An even better soldering is obtained if, according to a further embodiment of the invention, the surface of the soldering bath is cleared of possible contaminations present thereon, such as oxides and the like before the ends protruding from the circuit board are brought into contact with this surface. According to an embodiment of the invention, this purification may be effected in a simple manner, in that by lowering the circuit board towards the bath a skimmer is moved over the bath surface.

According to the invention, a member, supporting a circuit board is rigidly connected to a rod system forming a guide, which rod system comprises two rods, one of which is rigidly connected to the apparatus, while the second rod is rigidly connected to a horizontally and rotatably supported shaft, which shaft also has a balance weight in a manner such that the circuit board is horizontal in any position. The insertion of the board consequently becomes simple, while at the same time it is ensured that the plate touches the soldering level simultaneously in all points. In order to obtain a stable guide, two rod systems connected together are available which are located on either side of the bath.

The movement of the member lying in the bath may be obtained in a simple manner if a second horizontal shaft is available in the above noted horizontal rotatable shaft, which second shaft can rotate in the first shaft and to which the limbs of two T-shaped rods are rigidly connected. These limbs extend through two grooves in the first shaft and in which on one side of the transverse rods a horizontal supporting plate is connected which partially lies in the bath and the other ends are loaded by two draw springs, in which the two shafts are coupled by means lying outside the shafts in a manner such that during part of the rotation of the outer shaft the inner shaft is carried along.

The rotation of the outer shaft is effected in that on the outer shaft a lever is available which is provided with a roller in which a driven cam disc is present which is constructed as a cup-shaped disc and has a recess in the edge of the cup through which the cam may enter and may co-operate with the profiled inside of the cup. The drive of the inner shaft is carried out in that a second cam disc is available on the driven shaft and the inner shaft is provided with a lever which can co-operate with this cam disc. In this manner a compact assembly is obtained.

According to one embodiment of the invention, the bottom of the horizontal supporting plate may consist of steel wool which is provided with an adhering layer of solder and which is enclosed in a mantle of woven thin metal tape. Since it might occur that a projecting piece of steel wool is soldered to the circuit board, the bottom of the supporting plate, according to a further embodiment of the invention, preferably consists of perforated steel plate provided with an adhering layer of solder. In this case no adhering wire will occur of the side of the circuit board and the bath plate.

In order to obtain an even better soldering, according to an embodiment of the invention a skimmer is present for the surface of the bath, which skimmer is coupled to the guide mechanism for moving the mounting plate in a manner such that the bath surface is freed from impurities by the skimmer before the side of the mounting plate to be soldered comes in contact with the soldering surface.

A simple construction is obtained if, according to a further embodiment of the invention, the skimmer can be guided by two guide grooves present in the supporting member and is connected to a rod of the guide by a lever on both sides. As a result the surface of the bath is cleaned before the side of the mounting plate to be soldered comes in contact with this surface.

In order to perform the soldering cycle at least partially automatically, according to a further embodiment of the invention an electrical switch is available which may be operated by the downward motion of one of the rods of the guide and which may open and close the passage of current of an electric motor which drives the shaft with the cam discs.

Figure 2:
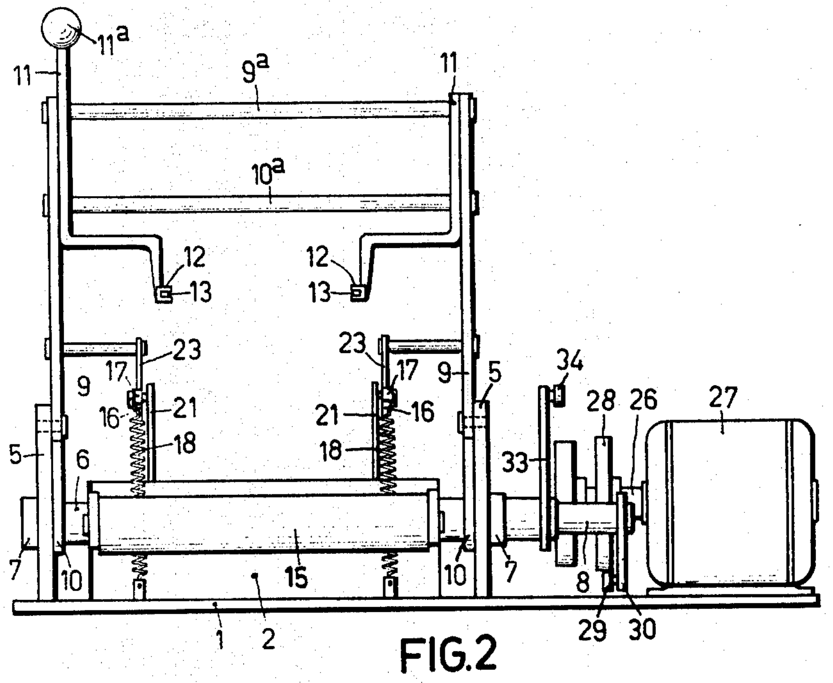
Figure 3:
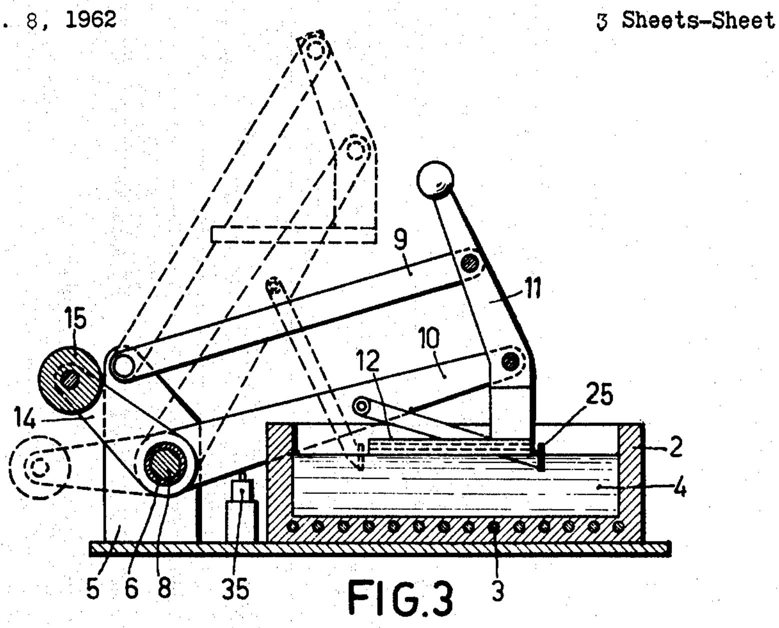
Figure 4:
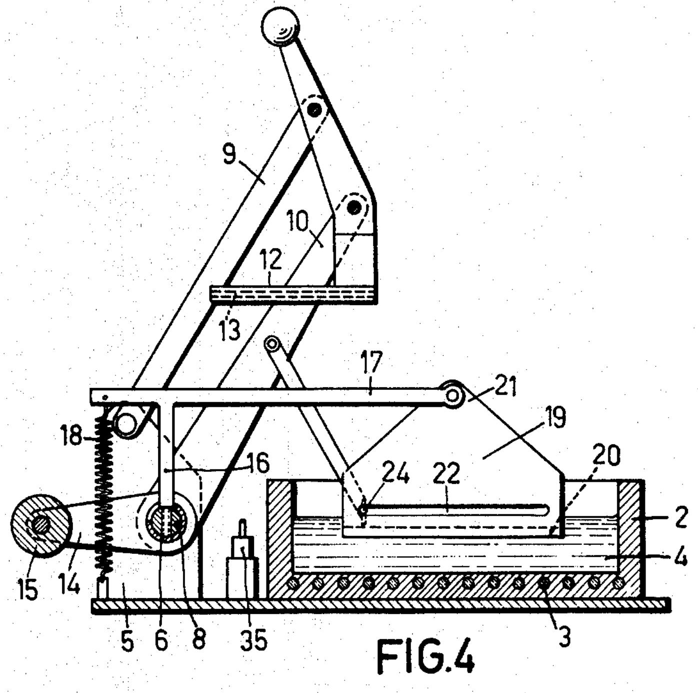
Figure 5:
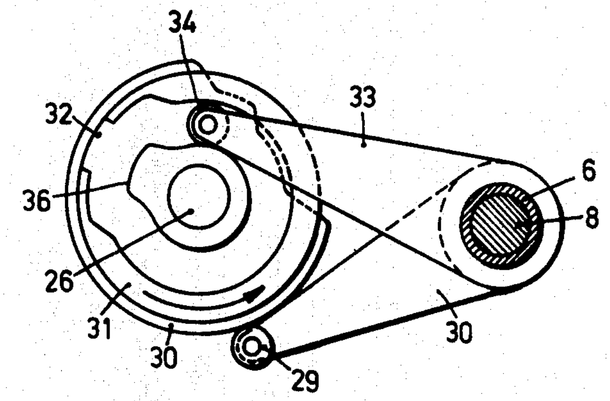
Figure 6:
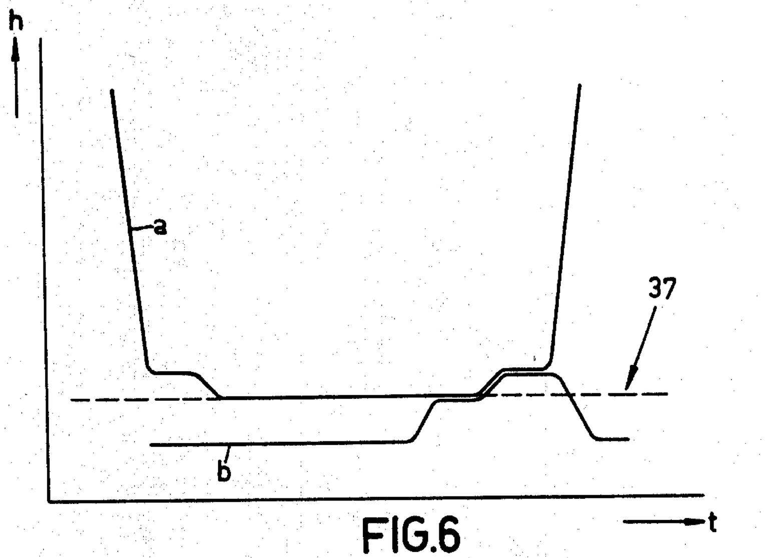

In order that the invention may readily be carried into effect, a preferred embodiment thereof will now be described in detail, by way of example, with reference to the accompanying drawings, in which:

FIGURE 1 is a plan view of a device for dip soldering mounting plates with printed wiring, FIGURE 2 is a front view of the device shown in FIGURE 1 in the position shown in dotted lines, FIGURE 3 is a cross section of the device shown in FIGURE 1 along the line I—I, viewed in the direction of the arrow, FIGURE 4 is the same cross-sectional view this time, however, taken along the line II—II and viewed in the direction of the arrow, FIGURE 5 is a cross-section along the line III—III shown in FIGURE 1 also viewed in the direction of the arrow, and FIGURE 6 is a graphical representation which shows the relationship between the movements of a mounting plate and of a member present in the soldering bath.

In the figures, reference numeral 1 is a platform on which a container 2 is supported. This container, which is provided with electrical heater 3 (FIG. 3), is filled with liquid tin-lead solder 4. On the platform 1, two upright supports 5 are available which support a hollow shaft 6. Two adjusting rings 7 determine the position of this shaft. The hollow shaft 6 surrounds an inner shaft 8 which projects beyond the shaft 6 on one side. On both sides of the container 4, two pair of levers 9 and 10 are present. One end of levers 9 are rotably connected to the supporting members 5, while one end of levers 10 are rigidly connected to the outer shaft 6. The other end of both pair of the two levers 9 and 10 are pivotally connected to a pair of levers 11. One of the levers 11 is elongated and is provided with a knob 11*a*. The two levers 9 and 10 at one side of the container are connected to the corresponding levers 9 and 10 located on the other side of the container by means of rods 9*a* and 10*a*. The lower sides of the levers 11 are provided with supporting members 12 which comprise grooves 13 into which a circuit board may be placed. The shaft 6 also supports rods 14 between which a balance weight 15 is attached.

As best seen in FIG. 4, limbs 16 of two T-shaped rods 17 are connected to the inner shaft 8. One end of the transverse rods of the T-shaped rods 17 are loaded by draw-springs 18. The other end of the rod 17 is rotatably connected to a carrier 19, the bottom of which consists of perforated steel plate 20 provided with a layer of solder. The side plates 21 of the carrier 19 comprise grooves 22 in each of which a stud 24, provided on a rod 23, may slide. Between the rods 23 a skimmer 25 is rigidly connected to the studs 24, which skimmer is partially dipped in the liquid solder 4. The rods 23 are rotatably connected to the rods 10 of the guide.

Referring now to FIGS. 1, 2 and 5, a shaft 26 is driven by an electric motor 27. A cam disc 28 is provided on this shaft 26 which disc cooperates with a roller 29 of a lever 30, the latter being rigidly connected to the inner shaft 8. In addition, a cam disc 31 provided with interior profile is provided on the shaft 26 which has an aperture 32 at its edge. A lever 33 is rigidly connected on shaft 6 which has at its end a roller 34 which fits in the aperture 32. On the supporting plate 1 there is a switch 35 (FIG. 3) which cooperates with the lever 10. On the inside of the cup-shaped disc 31 there is an adjustable stop 36.

A circuit board which at its lower side is provided with printed wiring and the top side of which comprises electrical component parts, the projections of which are passed downwards and out through holes in the board and are there cut off close to the wiring, is brought into the grooves 13 with the wiring downwards in the position of the device which is shown in dotted lines in FIGURE 3. Then, the rod system 9, 10 and 11 is lowered by means of the knob 11*a*, so that the board is moved towards the position shown in solid lines in FIGURE 3. As a result of this, first of all the rod 23 is moved, so that the studs 24 slide into the grooves 22, as a result of which the skimmer 25 passes from the position shown in FIGURE 4 into the position shown in FIGURE 3 and frees the surface of the bath from oxides and the like. The rotation of the rod system is continued until the roller 34 engages the circumference of the cup-shaped disc 31. The switch 35 is pressed in the meantime as a result of the movement of the rod 10, so that the electric motor 27 provided with a delaying transmission starts running. At a given instant, the roller 34, in the case of a continued pressure on the knob 11*a*, is forced through the aperture 32 and against the stop 36 after which the knob 11*a* may be disengaged. The interior profile of the cup-shaped disc 31 is such that as a result of the rotation of this disc the lower side of the circuit board to be soldered is brought in contact with the surface of the bath containing liquid solder 4 and remains in contact with it for a definite period of time. The stop 36 prevents the board from being immersed.

After some time, the cam disc 28 moves the lever 30 as a result of which the supporting member 19 is moved upwards and the perforated steel plate 20 is forced against the projections to be soldered at the lower side of the mounting plate. The profile of the cam disc 28 and the interior profile of the cup-shaped disc 31 are chosen so that after a short time the circuit board and steel plate 20 are moved upwards out of the bath together and remain together over the bath for a short period and at a short distance. After a definite period of time, the roller 34 may escape again from the cup-shaped disc 31 through the aperture 32 under the influence of the balance weight 15, while on the other hand the supporting member 19 again disappears into the bath. The switch 35 is now released and stops the motor.

In the graphical representation shown in FIGURE 6, the movements of the carrier 19 and of the circuit board provided in the grooves 13 are plotted. Time is plotted on the horizontal axis and vertical movement on the vertical axis. The surface of the bath is shown in dotted line 37. As may be seen from the representation, the movement of the plate indicated by line *a* at first occurs comparatively rapidly towards the surface of the bath. Then the surface of the board comes into contact with the surface of the bath and remains in contact with this surface for a definite period. The surface of the perforated plate 20, the movement of which is indicated by line *b*, lies below the surface of the solder. Before the board is removed from contact with the soldering bath, the plate 20 is moved upwards until it is in contact with the ends of the projections and then both plates move upwards until they are located just above the surface of the solder. At a given instant, the plate 20 moves downwards again and now the circuit board is rapidly moved upwards. It appears that no undesired bridging is formed on the soldering plate by solder. It has appeared from experiments that even at a mutual distance of two (printed) thin wires of 0.3 mm. no bridging occurs.

The bottom of the carrier 19 may consist of perforated metal plate 20 which is provided beforehand with an adhering layer of solder. Good results were obtained with a plate which had a thickness of 0.9 mm. and which was provided in a regular manner with holes having a diameter of 1.6 mm.; the pitch or spacing was 3 mm. Also a sponge consisting of a mantle of tinned steel tape of 0.1 x 0.3 mm. filled with steel wool gave good results. In this case it should be ensured that the wires of the steel wool do not project through the mantle since otherwise they may be soldered to the board as a result of which the sponge and/or the plate is/are destroyed.

When removing the circuit board from the bath, the space between the surface to be soldered and the plate or sponge 20 should be as small as possible. The ends of the projections are cut off as shortly as possible and the plate or sponge engages these ends. When using a plate it may be recommendable sometimes to provide it in the carrier in a resilient manner so that a correct engagement is ensured.

In order to prevent shocks when returning to the initial position, a shock-absorber may be provided as a buffer between one of the rods of the guide and the supporting plate.

The bath of liquid solder may be provided in known manner with a level control, for example by means of a contact finger. Also a temperature control by means of a thermostat may be provided. Finally, it is not necessary that on either side of the bath a guide with rods 9 and 10 is available. Such a guide may also be present on one side only. However, in the case of the double construction the device becomes more stable.

What is claimed is:

1. A method of dip soldering printed circuit boards which is particularly useful in soldering circuit boards having closely spaced component leads comprising, supporting said circuit board with at least the leads of said components in contact with the surface of a solder bath, moving a porous member normally located below the surface of said solder bath into contact with said leads, raising both said circuit board and porous member above said bath surface while held in contact with one another, and separating said board and member before solidification of the solder thereon.

2. The method according to claim 1 wherein said board and member are separated by moving said circuit board rapidly upwardly.

3. A method of dip soldering printed circuit boards having component leads spaced apart approximately 5 mm. and less comprising supporting said circuit board in contact with the surface of a solder bath, moving a porous member normally held below the surface of said bath into contact with said board at the surface of said bath, maintaining said board and member in contact while raising them above the surface of said bath, separating said board and member before solidification of the solder by returning said member below the surface of said bath, and substantially simultaneously moving said circuit board rapidly upwardly.

4. Apparatus for dip soldering a printed circuit board comprising means containing a liquid solder bath, movable guide means for supporting a circuit board in contact with the surface of said bath, porous means below the surface of said bath, means connected with said porous means for raising said porous means into abutment with said circuit board at the surface of said bath, and means for maintaining said abutment while raising said board and porous means above the surface of said solder bath and separating them above said surface.

5. Apparatus for dip soldering a printed circuit board comprising means containing a solder bath, movable guide means for moving a circuit board into contact with the surface of said bath, a porous member below the surface of said bath, means for movably supporting said porous member, and operating means connected with said guide means and said support means; said operating means including a first means for raising said porous member into abutment with a circuit board at the surface of said bath, a second means for maintaining said member and said board in abutment and elevating them above the surface of said bath, and a third means for separating said board and member above said bath and resubmerging said member.

6. Apparatus according to claim 5 wherein said movable guide means includes a skimmer connected with said guide means for skimming the surface of said bath upon movement of said guide means for placing said circuit board in contact with said surface.

7. Apparatus according to claim 5 wherein said movable guide means comprises a circuit board carrier, a rod system connected with said carrier at one extremity thereof, the other extremity of said rod system being connected with a rotatably supported hollow shaft, manual means for moving said rod system for lowering said circuit board, and driven cam means for driving said shaft and moving said rod system for raising said circuit board.

8. Apparatus according to claim 7 wherein said rod system supporting said carrier comprises a pair of parallel rods, one end of each rod of said pair of parallel rods being pivotally connected to said carrier, the other end of one of said pair of rods being fixedly connected to said shaft and the other end of the other of said rods being pivotally connected with said apparatus whereby said rods are moved toward and away from one another during movement of said carrier while remaining parallel.

9. Apparatus according to claim 8 wherein said rod system comprises a pair of said parallel rods at each side of said bath.

10. Apparatus according to claim 5 wherein said means for movably supporting said porous member comprises a T-shaped lever having one end of the cross piece of the T lever connected wtih said porous member, the other end of said cross piece being connected with means for biasing said lever to maintain said porous member within said bath, the stem of said T-shaped lever being connected with a rotatably supported shaft for moving said lever, and driven cam means for driving said shaft for moving said porous member.

11. Apparatus for dip soldering a printed circuit board having component leads spaced apart 5 mm. and less comprising means containing a solder bath, a circuit board carrier member, means supporting said carrier member for moving said circuit board into and out of contact with the surface of said bath, said means supporting said carrier comprising a pair of parallel arms at each side of said carrier member, one end of each of said arms being pivotally connected with said carrier member, the other end of one of the corresponding arms of each said pair of arms being pivotally connected with said apparatus and the other corresponding arms of each said pair of arms being fixedly connected with a hollow shaft, said hollow shaft being supported for rotation on said apparatus, a second shaft concentric within said hollow shaft, a pair of T-shaped levers, the stem of said T levers being connected to said second shaft adjacent each end thereof, a porous member connected at one end of the cross bar of said T levers, a spring connected to the other end of said cross bar for biasing said T lever to maintain said porous member below the surface of said bath, and means for sequentially driving said shafts upon contact of said circuit board with the surface of said bath for bringing said circuit board and porous member into abutting relation, raising said board and porous member above the surface of said bath while maintaining said relation, and separating said board and porous member.

12. Apparatus according to claim 11 wherein said porous member comprises a body of steel wool enclosed within a mantle of woven tape of metallic material.

13. Apparatus according to claim 11 wherein said porous member comprises a perforated plate of metal having a large porosity.

14. Apparatus according to claim 13 wherein said plate is uniformly perforated with holes having a diameter on the order of 1.6 mm. and the spacing between said holes being on the order of 3.0 mm.

References Cited by the Examiner

UNITED STATES PATENTS

| | | | |
|---|---|---|---|
| 2,877,731 | 3/1959 | Allen | 113—93 |
| 2,918,028 | 12/1959 | Wright | 113—93 |

JOHN F. CAMPBELL, *Primary Examiner.*